(12) United States Patent
Ermolov et al.

(10) Patent No.: US 8,558,287 B2
(45) Date of Patent: Oct. 15, 2013

(54) APPARATUS AND METHOD FOR INTRODUCING A CONTROLLABLE DELAY TO AN INPUT SIGNAL

(75) Inventors: Vladimir Alexsandrovich Ermolov, Espoo (FI); Meri Sari Helle, Helsinki (FI); Pirjo Marjaana Pasanen, Helsinki (FI); Markku Anttoni Oksanen, Helsinki (FI); Eira Tuulia Seppala, Helsinki (FI)

(73) Assignee: Nokia Corporation, Espoo (FI)

( * ) Notice: Subject to any disclaimer, the term of this patent is extended or adjusted under 35 U.S.C. 154(b) by 285 days.

(21) Appl. No.: 13/107,326

(22) Filed: May 13, 2011

(65) Prior Publication Data

US 2012/0286828 A1     Nov. 15, 2012

(51) Int. Cl.
*H01L 27/148*     (2006.01)

(52) U.S. Cl.
USPC .......... 257/241; 257/1; 257/48; 257/167; 257/E27.026; 257/E29.027

(58) Field of Classification Search
USPC .......... 257/1, 48, 167, 213, 215, 241, 288, 257/E27.026, E27.027, E27.028, E29.027, 257/E29.028, E29.052, E29.062
See application file for complete search history.

(56) References Cited

U.S. PATENT DOCUMENTS

| | | | | |
|---|---|---|---|---|
| 5,235,566 A * | 8/1993 | Merrill | | 368/113 |
| 5,343,081 A | 8/1994 | Nakamura | | 307/201 |
| 5,357,224 A | 10/1994 | Sterzer | | 333/103 |
| 6,242,990 B1 | 6/2001 | Sokolov | | 332/103 |
| 2009/0134338 A1 | 5/2009 | Eguchi et al. | | 257/27 |
| 2009/0174500 A1 | 7/2009 | Bertin et al. | | 333/160 |

FOREIGN PATENT DOCUMENTS

NL     8701677     2/1989

OTHER PUBLICATIONS

Ouyang, et al., "Scaling Behaviors of Graphene Nanoribbon FETs: A Three-Dimensional Quantum Simulation Study", IEEE Transactions of Electron Devices, vol. 54, No. 9, (Sep. 2007), (pp. 2223-2231).
K.I. Bolotin et al., "Ultrahigh electron mobility in suspended graphene", Solid State Communications 146, 2008, pp. 351-355.
C. R. Dean et al., "Boron nitride substrates for high-quality grapheme electronics", Nature Nanotechnology, vol. 5, Oct. 2000, pp. 722-726.

(Continued)

*Primary Examiner* — Eduardo A Rodela
(74) *Attorney, Agent, or Firm* — Harrington & Smith

(57) ABSTRACT

An apparatus including a first electrode portion configured to inject charge carriers; a second electrode portion configured to collect charge carriers and provide an output signal; a third electrode portion configured to collect charge carriers and provide an output signal; a monolithic semiconductor, providing a first channel for the transport of injected charge carriers between the first electrode portion and the second electrode portion and providing a second channel for the transport of injected charge carriers between the first electrode portion and the third electrode portion, wherein the first channel is configured such that a charge carrier injected at the first electrode portion will reach the second electrode portion via the first channel after a first transport time and the second channel is configured such that a charge carrier injected at the first electrode portion will reach the third electrode portion via the second channel after a second transport time greater than the first transport time; and at least one gate electrode coupled to the monolithic semiconductor configured to enable switching a route for charge carrier transport between at least the first channel and the second channel.

16 Claims, 3 Drawing Sheets

(56) References Cited

OTHER PUBLICATIONS

Jian-Hao Chen et al., "Intrinsic and extrinsic performance limits of grapheme devices on $SiO_2$", Nature Nanotechnology, vol. 3, 2008, pp. 206-209.

J.F. Tian et al., "Ambipolar grapheme filed effect transistors by local metal side gates", Applied Physics Letters 96, 231110, 2010, 3 pgs.

F. Molitor et al., "Local gating of a grapheme Hall bar by grapheme side gates", Physical Review B 76, 245426, 2007, 5 pgs.

A. Javey et al., "Ballistic carbon nanotube field-effect transistors", Nature, vol. 424, 654, 2003, pp. 654-657.

Joshua A. Robinson et al., "Contacting graphene", Applied Physics Letters 98, 053103, 2011, 3 pgs.

Ph. Avouris et al., "Carbon-based electronics", Nature Nanotechnology 2, Oct. 2007, pp. 605-615.

F. Liu et al., "Optically Tunable Delay Line in Silicon Microring Resonator Based on Thermal Nonlinear Effect", IEEE 2008, pp. 706-712.

Zhaohui Zhong et al., "Terahertz time-domain measurement of ballistic electron resonance in a single-walled carbon nanotube", Nature Nanotechnology, vol. 3, Apr. 2008, pp. 201-205.

* cited by examiner

APPARATUS AND METHOD FOR INTRODUCING A CONTROLLABLE DELAY TO AN INPUT SIGNAL

TECHNOLOGICAL FIELD

Embodiments of the present invention relate to an apparatus and method for introducing a controllable delay to an input signal.

BACKGROUND

In modern electronics it can be desirable to introduce a controlled delay to a signal.

For very high speed electronics, it may be necessary to introduce a small tunable delay of less than 1 ps.

BRIEF SUMMARY

According to various, but not necessarily all, embodiments of the invention there is provided an apparatus comprising: a first electrode portion configured to inject charge carriers; a second electrode portion configured to collect charge carriers and provide an output signal; a third electrode portion configured to collect charge carriers and provide an output signal; a monolithic semiconductor, providing a first channel for the transport of injected charge carriers between the first electrode portion and the second electrode portion and providing a second channel for the transport of injected charge carriers between the first electrode portion and the third electrode portion, wherein the first channel is configured such that a charge carrier injected at the first electrode portion will reach the second electrode portion via the first channel after a first transport time and the second channel is configured such that a charge carrier injected at the first electrode portion will reach the third electrode portion via the second channel after a second transport time greater than the first transport time; and at least one gate electrode coupled to the monolithic semiconductor configured to enable switching a route for charge carrier transport between at least the first channel and the second channel.

According to various, but not necessarily all, embodiments of the invention there is provided an apparatus as claimed in any preceding claim, wherein the monolithic semiconductor comprises: a first side comprising the first electrode portion; a second side opposing the first side and comprising the second electrode portion and the third electrode portion; a third side joining the first side and the second side and located closer to the second electrode portion than the third electrode portion; and a fourth side opposing the third side and joining the first side and the second side and located closer to the third electrode portion than the second electrode portion.

According to various, but not necessarily all, embodiments of the invention there is provided a method comprising: injecting at least one charge carrier into a monolithic semiconductor; controlling a voltage applied to at least one gate electrode coupled to a monolithic semiconductor to control a transport time of an injected charge carrier across the monolithic semiconductor; and collecting an injected charge carrier after transport across the monolithic semiconductor.

BRIEF DESCRIPTION

For a better understanding of various examples of embodiments of the present invention reference will now be made by way of example only to the accompanying drawings in which.

Figure 5:
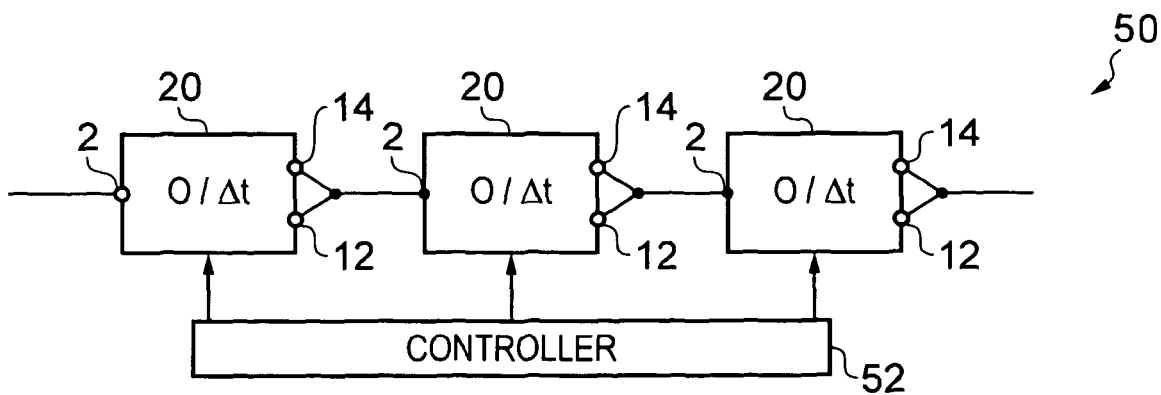
Figure 6:
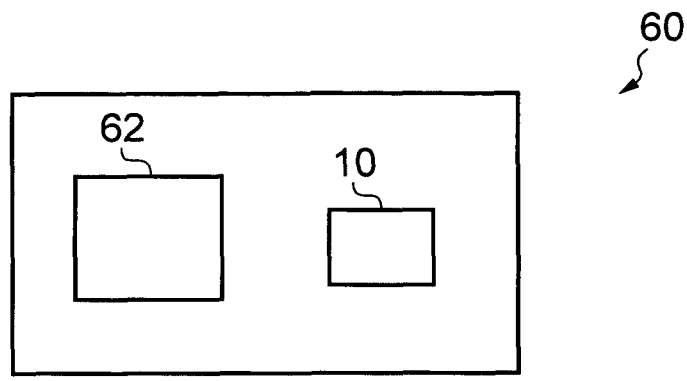
Figure 7:
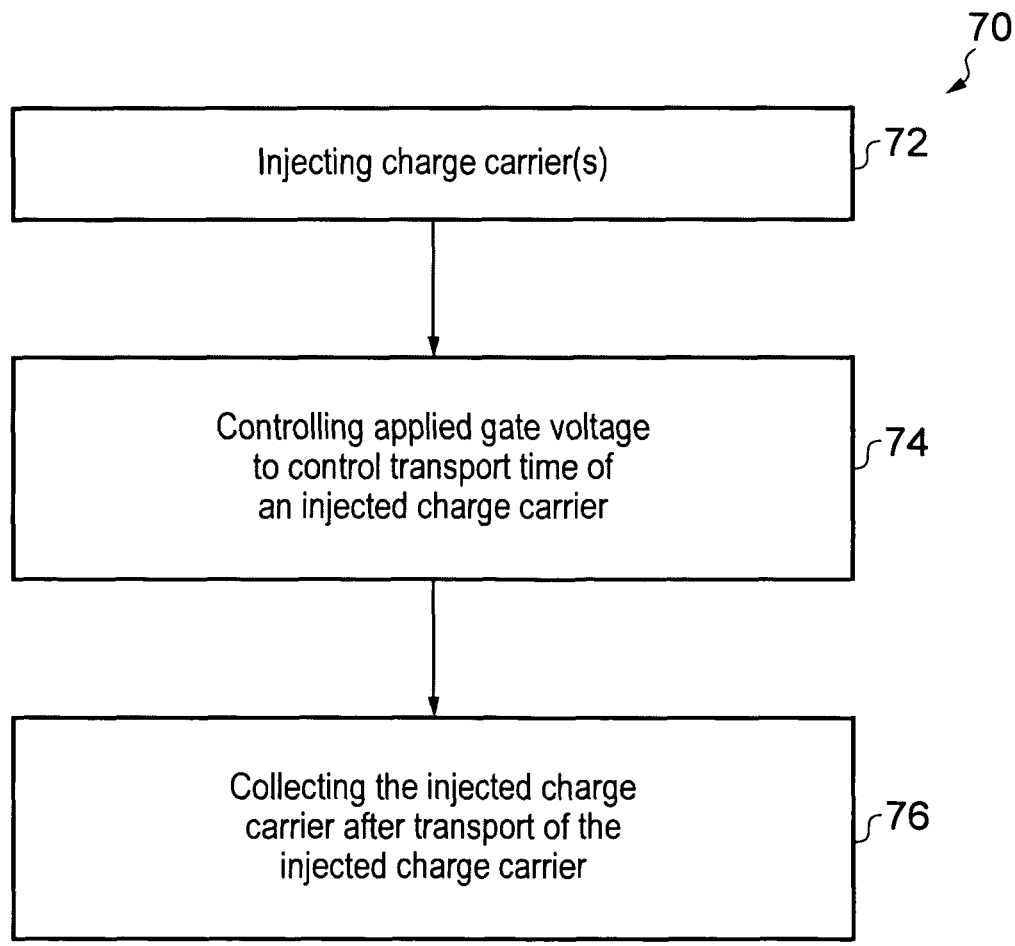

FIG. 5 schematically illustrates a cascaded series of controllable delay elements;

FIG. 6 illustrates a high frequency apparatus or system comprising the apparatus; and FIG. 7 illustrates a method of introducing a controllable delay to an input signal.

DETAILED DESCRIPTION

Figure 1:
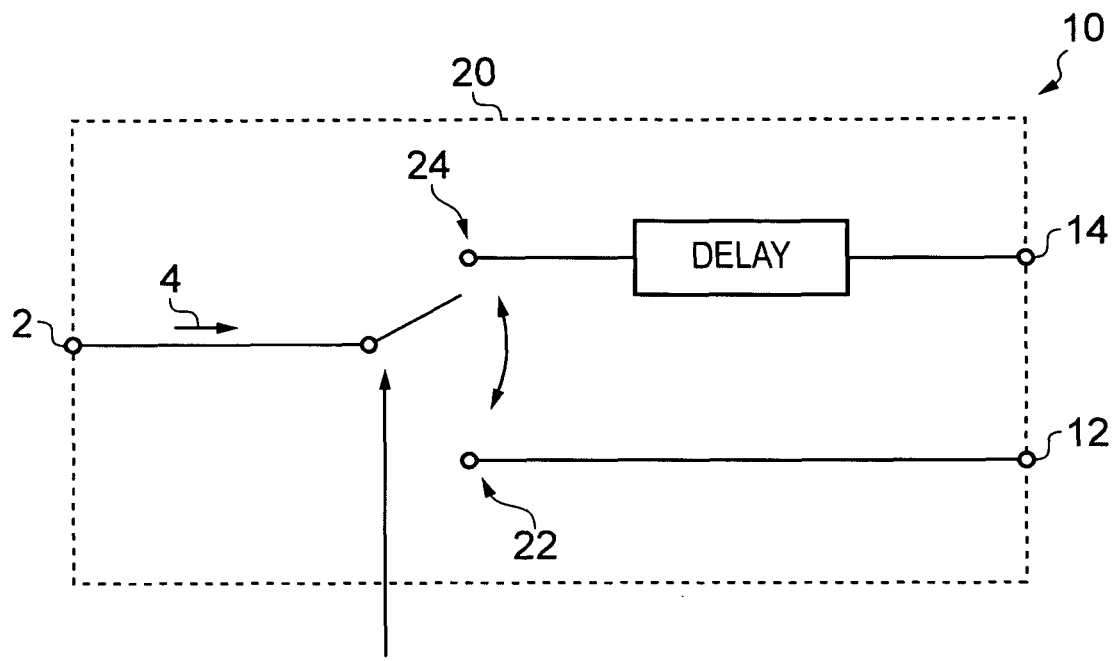
FIG. 1 is a schematic illustration of an apparatus 10 and its functionality.

FIG. 1 is a schematic illustration of an apparatus 10. The illustration illustrates functionality of the apparatus 10 which is configured to introduce a controllable delay to an input signal. The delay may be less than 1 ps, it may for example be of the order 0.1 ps or less.

The illustrated apparatus 10 comprises: a first electrode portion 2 configured to inject charge carriers 4; a second electrode portion 12 configured to collect charge carriers 4 and provide an output signal; and a third electrode portion 14 configured to collect charge carriers 4 and provide an output signal.

There is a first channel 22 for the transport of injected charge carriers 4 between the first electrode portion 2 and the second electrode portion 12. The first channel 22 is configured such that a charge carrier 4 injected at the first electrode portion 2 will reach the second electrode portion 12 via the first channel 22 after a first transport time t1.

There is a second channel 24 for the transport of injected charge carriers 4 between the first electrode portion 2 and the third electrode portion 14. The second channel 24 is configured such that a charge carrier 4 injected at the first electrode portion 2 will reach the third electrode portion 14 via the second channel 24 after a second transport time t2 greater than the first transport time t1.

The apparatus 10 is configured to enable switching a route for charge carrier transport at least between either the first channel 22 or the second channel 24. The apparatus therefore provides the input signal received at the first electrode portion 2 as an output at either the second electrode portion 12 (without delay) or the third electrode portion 12 (with delay) but not both.

Figure 2:
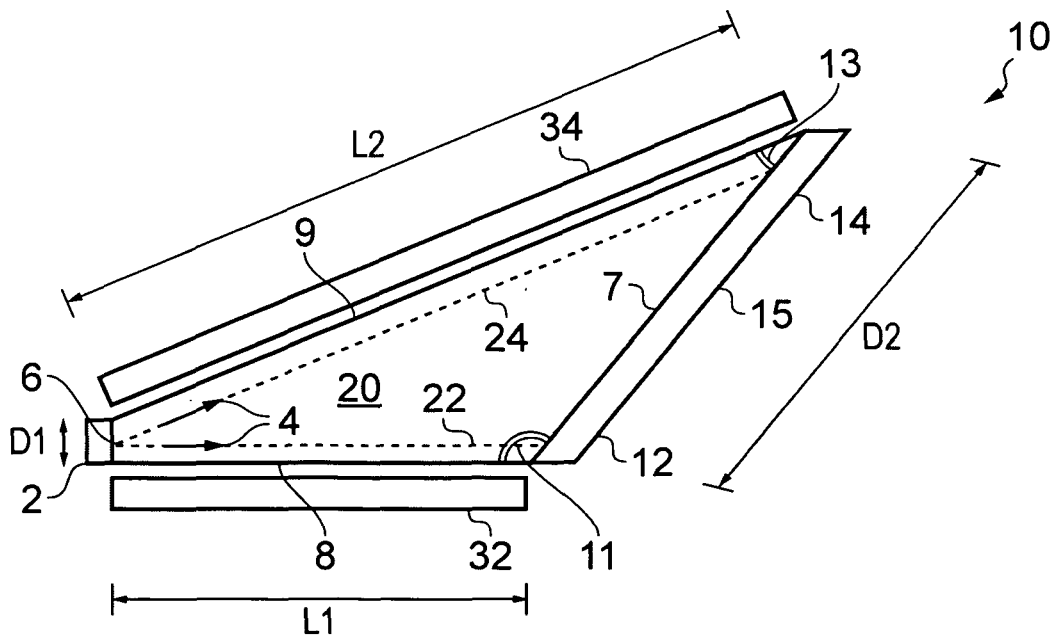
FIG. 2 is a schematic illustration, in plan view, of an apparatus with an emphasis on its structure.

FIG. 2 is a schematic illustration, in plan view, of an apparatus 10 with an emphasis on its structure.

In FIG. 2 a monolithic semiconductor 20 provides multiple channels for the transport of injected charge carriers 4 between the first electrode portion 2 and the collector electrode 15. A channel is a transport route through the monolithic semiconductor 20.

A first side gate electrode 32 and a second gate electrode 34 are coupled via dielectric to the monolithic semiconductor 20 on opposing sides 8, 9 of the monolithic semiconductor 20.

A voltage applied at the first side gate electrode 32 and/or the second side gate electrode 34 can be used to control the route (channel) charge carriers take between the first electrode portion 2 and the collector electrode 15.

The voltage(s) applied to the first side gate electrode 22 and/or the second side gate electrode 24 may be continuously tuned to tune a delay introduced to a signal. Tuning the voltage(s) changes the charge carrier route (the channel) and hence the delay by changing the position on the collector electrode 15 where a pulse of charge carriers, injected by the first electrode portion 2, arrives.

For example, the voltages applied may attract charge carriers towards following the first channel 22 and repel charge carriers away from the second channel 24.

Alternatively, the voltages applied may attract charge carriers towards following the second channel 24 and repel charge carriers away from the first channel 22.

The first side gate electrode 22 and/or the second side gate electrode 24 are thus configured to enable switching a route for charge carrier transport at least between the first channel 22 and the second channel 24.

In the example illustrated in FIG. 2, the first channel 22 has a first length L1 between the first electrode portion 2 and the second electrode portion 12. The second channel 24 has a second length L2 between the first electrode portion 2 and the third electrode portion 14 that is greater than the first length L1.

In this example, the monolithic semiconductor 20 is undoped but in other implementations the monolithic semiconductor may be doped. The doping may be consistent or vary across a width of the monolithic semiconductor. If the monolithic semiconductor is doped consistently or undoped then the first channel 22 and the second channel 24 will have substantially the same charge carrier mobility. The mobility can be increased by increasing the concentration of dopant. The charge carrier density may be greater than $1 \times 10^{12}$ cm$^{-2}$.

The monolithic semiconductor 20 has a high charge carrier mobility. It may, for example, have a Fermi velocity of the order $10^6$ ms$^{-1}$. The charge carriers undergo ballistic transport (as opposed to diffusive transport) across a length of the monolithic semiconductor 20. The mean free path is typically of the order ~1 μm for ballistic transport and this may be longer than a maximum length of the monolithic semiconductor 20. For example, the longer second length L2 may be less than the mean free path of a charge carrier in the monolithic semiconductor 20.

A difference (e.g. L2–L1) between the longest route 24 and shortest route 22 across the monolithic semiconductor 20 may be greater than 100 nm or another value selected to provide a suitable transport time difference (delay) between the first channel 22 and the second channel 24.

A route length difference of 100 nm with a Fermi velocity of the order $10^6$ ms$^{-1}$ results in a transport time difference of $100 \times 10^{-15}$ s (0.1 ps).

The monolithic semiconductor 20 may comprise graphene. The graphene may be formed from a two-dimensional graphene ribbon. Graphene has an advantage in that the component fabrication is possible using similar processing methods as is used for CMOS circuits, such as lithography. The graphene may be a two-dimensional (2D) monolayer. Monolayer graphene is a semi-metal (a semiconductor with zero band gap) in its pristine state without any treatments.

Alternatively the monolithic semiconductor 20 may comprise a III-V semiconductor e.g. Gallium Arsenide GaAs or Aluminum gallium Arsenide AlGaAs.

The apparatus 10 may operate at room temperatures (e.g. 20° C.). Alternatively, some form of cooling of the monolithic semiconductor 20 may be provided to increase charge carrier mobility. The cooling may, for example, involve cryogenic cooling using liquid nitrogen.

In some embodiments the apparatus 10 may also comprise a top gate electrode (and possibly a back gate electrode). These electrodes may be used to control charge carrier density within the monolithic semiconductor 20 and hence control charge carrier mobility.

Referring to FIG. 2, the monolithic semiconductor may have a particular geometry so that different transport routes for charge carriers across the monolithic semiconductor have different lengths.

In the illustrated example the monolithic semiconductor 20 is a quadrilateral comprising: a first side 6 comprising the first electrode portion 2; a second side 7 opposing the first side 6 and comprising the second electrode portion 12 and the third electrode portion 14; a third side 8 joining the first side 6 and the second side 7 and located closer to the second electrode portion 12 than the third electrode portion 14; and a fourth side 9 opposing the third side 8 and joining the first side 6 and the second side 7 and located closer to the third electrode portion 14 than the second electrode portion 12.

The monolithic semiconductor 20 has a width D that increases with distance from the first electrode portion 2. The third side 8 and the fourth side 9 are separated at the first side 6 by a first distance D1 whereas the third side 8 and the fourth side 9 are separated at the second side 7 by a second distance D2 greater than the first distance D1. The separation D between the third side 8 and the fourth side 9 increases linearly with distance from the first side 6 (D1) to a maximum value at the second side 7 (D2).

In the illustrated example the monolithic semiconductor has a tilted geometry. The second side 7 meets the third side 8 at a first angle 11 and the second side 7 meets the fourth side 9 at a second 13 angle less than the first angle 11. In the illustrated example, the first angle 11 is obtuse and the second angle 13 is acute.

In the illustrated example a single first gate electrode 32 is located at the third side 8 and extends along the whole of the third side. However, in other embodiments the single first gate electrode 32 located at the third side 8 may extend only partially along the third side 8. In other embodiments, there may be multiple first gate electrodes 32 located along the third side 8.

In the illustrated example a single second gate electrode 34 is located at the fourth side 9 and extends along the whole of the fourth side 9. However, in other embodiments the single second gate electrode 34 located at the fourth side 9 may extend only partially along the fourth side 9. In other embodiments, there may be multiple second gate electrodes 34 located along the fourth side 9.

The first electrode portion 6 may have a width 100-200 nm. It may be formed as an Ohmic contact between the monolithic semiconductor 20 at its first side 6 and a deposited metal. As an example, the monolithic semiconductor 20, if graphene, may have a gentle oxygen plasma treatment prior to metallization by deposition of palladium. The first electrode portion 6 operates as a source when the charge carriers 4 are electrons.

The collector electrode 15 that provides the second electrode portion 12 and the third electrode portion 14 may be formed as an Ohmic contact between the monolithic semiconductor 20 at its second side 7 and a deposited metal. As an example, the monolithic semiconductor 20, if graphene, may have a gentle oxygen plasma treatment prior to metallization by deposition of palladium. The collector electrode 15 may, as an example, have a length of 1-2 μm. The collector electrode 15 operates as a drain when the charge carriers 4 are electrons.

Figure 3:
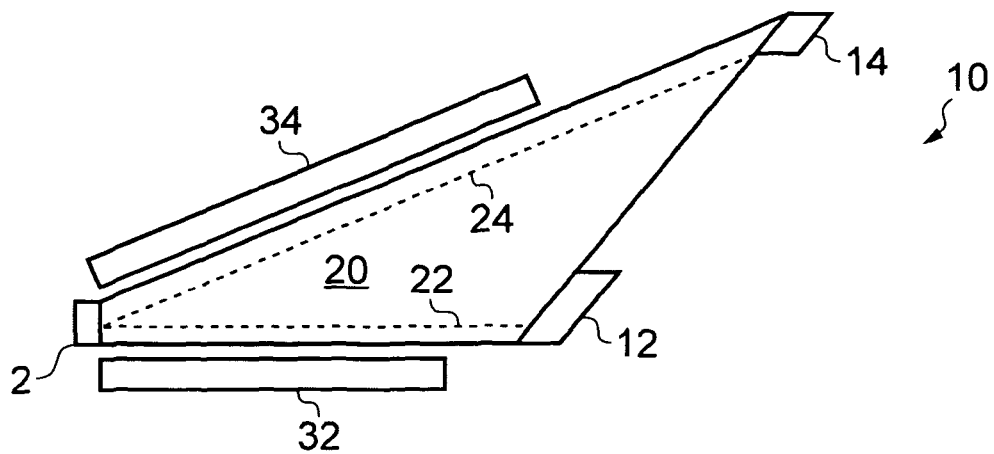
FIG. 3 is a schematic illustration, in plan view, of an apparatus with an emphasis on structure that has a different configuration of collector electrodes than the apparatus illustrated in FIG. 2.

FIG. 3 is a schematic illustration, in plan view, of an apparatus 10 with an emphasis on structure that has a different configuration of collector electrodes than the apparatus illustrated in FIG. 2.

In the apparatus 10 illustrated in FIG. 2 a single collector electrode 15 provides both the second electrode portion 12 and the third electrode portion 14.

In the apparatus 10 illustrated in FIG. 3 the second electrode portion 12 and the third electrode portion 14 are distinct and separate collector electrodes.

Each of the separate collector electrodes 12, 14 may have a width similar to the width of the first electrode portion 2 e.g. 100-200 nm. Each of the separate collector electrodes 12, 14 may be formed as an Ohmic contact between the monolithic semiconductor 20 at its second side 7 and a deposited metal. As an example, the monolithic semiconductor 20, if graphene, may have a gentle oxygen plasma treatment prior to metallization by deposition of palladium.

Figure 4:
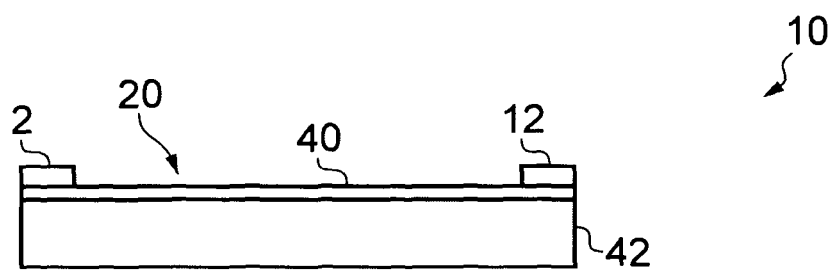
FIG. 4 illustrates, in cross-section view, an example of the apparatus that has a graphene monolayer 40.

FIG. 4 illustrates, in cross-section view, an example of the apparatus 10 in which the monolithic semiconductor 20 is a graphene monolayer 40.

The graphene monolayer 40 is supported by a dielectric substrate 42. The dielectric substrate 42 may be formed, for example, from silicon dioxide or, hexagonal dielectric boron nitride.

The first electrode portion 2 and the second electrode portion 12 (and the third electrode portion 14, as well as the side gates 32, 34) may be formed at same time same in a single lithographic process.

FIG. 5 schematically illustrates a system or apparatus 50 that comprises a plurality of monolithic semiconductors 20 arranged in a cascaded series.

The outputs from the second electrode portion 12 and the third electrode portion of the $n^{th}$ monolithic semiconductor 20 in the series provides an input to the first electrode portion 2 of the $(n+1)^{th}$ monolithic semiconductor 20 in the series. Each of the monolithic semiconductors 20 receives control voltage(s) from a controller 52 that controls separately the first and/or second side gate electrodes 32, 34 of each monolithic semiconductor 20. The series of monolithic semiconductors 20 therefore forms a programmable delay element.

The controller 52 can separately control the delay introduced by each monolithic semiconductor 20 in the series of monolithic semiconductors.

The controller 52 may access a look-up table storing a mapping of different delay values to different configurations of voltages applied to the first and/or second side gate electrodes 32, 34 of the different monolithic semiconductors 20 in the series of monolithic semiconductors 20.

FIG. 6 illustrates a high frequency apparatus or system 60. The high frequency apparatus 60 comprises high frequency electronic circuitry 62 configured to operate above $1 \times 10^{(9)}$ Hz. The apparatus 10 may be used to control a delay of a signal used by the high frequency electronic circuitry 62.

As an example, the high frequency electronic circuitry may comprise a delay locked loop (DLL) and the apparatus 10 (or 50) may control a delay used to program the delay locked loop.

In alternative embodiments, the apparatus 10 (or 50) may control a delay used in time domain filters such as finite-impulse-response (FIR) filters or may control a delay used in time delay elements for antenna arrays or for signal correlation.

FIG. 7 illustrates a method 70. The method 70 comprises a series of blocks 72, 74, 76.

The method 70 starts at block 72 where at least one charge carrier is caused to be injected into a monolithic semiconductor 20 from an injector electrode 2 of the monolithic semiconductor 20.

At block 74, a transport time across the monolithic semiconductor of an injected charge carrier is controlled by controlling a voltage applied to at least one gate electrode 32, 34 coupled to the monolithic semiconductor 20.

Varying the voltage applied to the at least one gate electrode varies the transport time of the injected charge carrier across the monolithic semiconductor 20.

At block 76, the injected charge carrier after transport across the monolithic semiconductor is collected at a collector electrode of the monolithic semiconductor 20.

The controller 52 illustrated in FIG. 5 may be used to control a delay provided by a single monolithic semiconductor 20. It may be additional to the apparatus 10 or comprised in the apparatus 10.

The controller 52 may be implemented using instructions that enable hardware functionality, for example, by using executable computer program instructions in a general-purpose or special-purpose processor that may be stored on a computer readable storage medium (disk, memory etc) to be executed by such a processor.

As used here 'module' refers to a unit or apparatus that excludes certain parts/components that would be added by an end manufacturer or a user. The apparatus 10 may be a module.

Although embodiments of the present invention have been described in the preceding paragraphs with reference to various examples, it should be appreciated that modifications to the examples given can be made without departing from the scope of the invention as claimed.

Features described in the preceding description may be used in combinations other than the combinations explicitly described.

Although functions have been described with reference to certain features, those functions may be performable by other features whether described or not.

Although features have been described with reference to certain embodiments, those features may also be present in other embodiments whether described or not.

Whilst endeavoring in the foregoing specification to draw attention to those features of the invention believed to be of particular importance it should be understood that the Applicant claims protection in respect of any patentable feature or combination of features hereinbefore referred to and/or shown in the drawings whether or not particular emphasis has been placed thereon.

We claim:

1. An apparatus comprising:
   a first electrode portion configured to inject charge carriers;
   a second electrode portion configured to collect charge carriers and provide an output signal;
   a third electrode portion configured to collect charge carriers and provide an output signal;
   a monolithic semiconductor, providing a first channel for the transport of injected charge carriers between the first electrode portion and the second electrode portion and providing a second channel for the transport of injected charge carriers between the first electrode portion and the third electrode portion, wherein the first channel is configured such that a charge carrier injected at the first electrode portion will reach the second electrode portion via the first channel after a first transport time and the second channel is configured such that a charge carrier injected at the first electrode portion will reach the third electrode portion via the second channel after a second transport time greater than the first transport time; and
   at least one gate electrode coupled to the monolithic semiconductor configured to enable switching a route for charge carrier transport between at least the first channel and the second channel.

2. An apparatus as claimed in claim 1, wherein the first channel has a first length between the first electrode portion and the second electrode portion and the second channel has a second length between the first electrode portion and the third electrode portion that is greater than the first length.

3. An apparatus as claimed in claim 1, wherein the first channel and the second channel have substantially the same charge carrier density doping.

4. An apparatus as claimed in claim 1, wherein the first channel and the second channel have substantially the same electron mobility.

5. An apparatus as claimed in claim 1, wherein the monolithic semiconductor comprises graphene.

6. An apparatus as claimed in claim 1, wherein the monolithic semiconductor comprises a graphene monolayer.

7. An apparatus as claimed in claim 6, wherein the graphene monolayer is supported by a dielectric substrate.

8. An apparatus as claimed in claim 1, wherein the monolithic semiconductor is configured for ballistic transport of a charge carrier along both the first channel and the second channel.

9. An apparatus as claimed in claim 1, wherein the monolithic semiconductor comprises
   a first side comprising the first electrode portion;
   a second side opposing the first side and comprising the second electrode portion and the third electrode portion;
   a third side joining the first side and the second side and located closer to the second electrode portion than the third electrode portion; and
   a fourth side opposing the third side and joining the first side and the second side and located closer to the third electrode portion than the second electrode portion.

10. An apparatus as claimed in claim 9, wherein the third side and the fourth side are separated at the first side by a first distance and wherein the third side and the fourth side are separated at the second side by a second distance greater than the first distance.

11. An apparatus as claimed in claim 9, wherein a separation between the third side and the fourth side increases linearly with distance from the first side.

12. An apparatus as claimed in claims 9 comprising a first gate electrode located at the third side and a second gate electrode located at the fourth side.

13. An apparatus as claimed in claim 1, wherein the second side comprises a single electrode, wherein the second electrode portion is a portion of the single electrode and the third electrode portion is a portion of the single electrode.

14. An apparatus as claimed in claim 1 wherein the second electrode portion is distinct and separated from the third electrode portion.

15. An apparatus as claimed in claim 1, arranged in a series cascaded monolithic semiconductors.

16. An apparatus as claimed in claim 1, further comprising high frequency electronic circuitry configured to operate above $1 \times 10^{9}$ Hz.

* * * * *